United States Patent
Li (10) Patent No.: US 10,614,737 B1
(45) Date of Patent: Apr. 7, 2020

(54) SUPPLY VOLTAGE CONTROL CIRCUIT FOR DISPLAY PANEL, DISPLAY PANEL AND DISPLAY DEVICE

(71) Applicants: HKC CORPORATION LIMITED, Shenzhen, Guangdong (CN); CHONGQING HKC OPTOELECTRONICS TECHNOLOGY CO., LTD., Chongqing (CN)

(72) Inventor: Wenxin Li, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/313,025

(22) PCT Filed: Nov. 16, 2018

(86) PCT No.: PCT/CN2018/115955
§ 371 (c)(1),
(2) Date: Dec. 22, 2018

(30) Foreign Application Priority Data

Oct. 25, 2018 (CN) .......................... 2018 2 1740649

(51) Int. Cl.
*G09G 3/20* (2006.01)
*H03F 3/45* (2006.01)

(52) U.S. Cl.
CPC ....... *G09G 3/20* (2013.01); *G09G 2310/0267* (2013.01); *G09G 2310/0275* (2013.01); *G09G 2310/08* (2013.01); *G09G 2330/021* (2013.01); *G09G 2330/028* (2013.01); *H03F 3/4508* (2013.01)

(58) Field of Classification Search
CPC ................. G09G 3/20; G09G 2310/08; G09G 2330/021; G09G 2330/028
See application file for complete search history.

(56) References Cited

U.S. PATENT DOCUMENTS

| | | | | |
|---|---|---|---|---|
| 7,928,973 B2 * | 4/2011 | Oku | ........................ | G09G 3/367 345/211 |
| 9,553,510 B2 * | 1/2017 | Tsukiji | .................. | H02M 3/156 |
| 10,404,086 B2 * | 9/2019 | Wu | ........................ | H02J 7/0068 |
| 2016/0043541 A1 * | 2/2016 | Choi | .................... | G09G 3/3614 345/212 |
| 2017/0237276 A1 * | 8/2017 | Onishi | .................... | H02M 3/07 320/108 |
| 2018/0075924 A1 * | 3/2018 | Umezaki | ................ | H01L 29/786 |
| 2018/0308874 A1 * | 10/2018 | Umezaki | ............. | G02F 1/13624 |

* cited by examiner

*Primary Examiner* — Ricardo Osorio (57) ABSTRACT

A supply voltage control circuit for a display panel, a display panel and a display device, wherein the supply voltage control circuit includes: a clock, a first conductive device, a second conductive device and an operational amplifying device; the supply voltage control circuit is configured to amplify supply voltage.

20 Claims, 5 Drawing Sheets

SUPPLY VOLTAGE CONTROL CIRCUIT FOR DISPLAY PANEL, DISPLAY PANEL AND DISPLAY DEVICE

CROSS-REFERENCE TO RELATED APPLICATION

This application is the PCT Application No. PCT/CN2018/115955 for entry into US national phase, with an international filing date of Nov. 16, 2018 designating US, now pending, and claims priority to Chinese Patent Application No. 201821740649.7, filed on Oct. 25, 2018, the content of which is incorporated herein by reference in its entirety.

TECHNICAL FIELD

The present disclosure pertains to the technical field of electronics, and more particularly to a supply voltage control circuit for a display panel, a display panel and a display device.

BACKGROUND

A traditional supply voltage enhancement circuit cannot perform an adaptive adjustment automatically for enhancement capability of a supply voltage (i.e., $V_{COM}$ voltage), and cannot meet the requirement of rated power input of a display panel, has a low practical value, and thus cannot provide a $V_{COM}$ voltage having a normal voltage amplitude to the display panel.

SUMMARY

An object of the present disclosure is to provide a supply circuit control circuit, a display panel and a display device, which aims at solving a technical problem including but is not limited to a problem that the supply voltage enhancement circuit in the display panel is low in comparability, the circuit structure is low in flexibility, such that the $V_{COM}$ voltage can't meet the requirement of reaching the rated power input of the display panel.

In order to solve the aforesaid technical problem, the technical solution to be used by the present disclosure is as follows:

a supply voltage control circuit for a display panel, including:

a clock configured to generate a clock signal;

a first conductive device, wherein a first conductive end of the first conductive device is connected with a power supply, a control end of the first conductive device is connected with the clock, and the first conductive device is configured to be turned on or turned off according to the clock signal and generate a power driving signal when being turned on;

a second conductive device, wherein a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and an operational amplifying device, wherein a first input of the operational amplifying device is connected with the supply voltage output of the display panel, a second input of the operational amplifying device is connected with a reference voltage signal, a power terminal of the operation amplifier unit is connected with a second conductive end of the first conductive device, and the operation amplifier unit is configured to amplify and output the supply voltage of the display panel according to the power driving signal.

Another object of the present disclosure is to provide a display panel, including: at least one scanning line which is vertically arranged in array;

at least one data line which is horizontally arranged in array;

a grid driver connected with the scanning line and configured to generate a scanning signal;

a source driver connected with the data line and configured to generate a data signal; and a supply voltage control circuit for the display panel connected with the scanning line and the data line, where the supply voltage control circuit includes:

a clock configured to generate a clock signal;

a first conductive device, where a first conductive end of the first conductive device is connected with a power supply, a control end of the first conductive device is connected with the clock, and the first conductive device is configured to be turned on or turned off according to the clock signal and generate a power driving signal when being turned on;

a second conductive device, where a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and an operational amplifying device, where a first input of the operational amplifying device is connected with the supply voltage output of the display panel, a second input of the operational amplifying device is connected with a reference voltage signal, a power terminal of the operation amplifier unit is connected with a second conductive end of the first conductive device, and the operation amplifier unit is configured to amplify and output the supply voltage of the display panel according to the power driving signal.

Another object of the present disclosure is to provide a display device, including a display panel;

where the display panel includes:

at least one scanning line which is vertically arranged in array;

at least one data line which is horizontally arranged in array;

a grid driver connected with the scanning line and configured to generate a scanning signal;

a source driver connected with the data line and configured to generate a data signal; and a supply voltage control circuit for the display panel connected with the scanning line and the data line, where the supply voltage control circuit includes:

a clock configured to generate a clock signal;

a first conductive device, where a first conductive end of the first conductive device is connected with a power supply, a control end of the first conductive device is connected with the clock, and the first conductive device is configured to be turned on or turned off according to the clock signal and generate a power driving signal when being turned on;

a second conductive device, where a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and an operational amplifying device, where a first input of the operational amplifying device is connected with the supply voltage output of the display panel, a second input of the operational amplifying device is connected with a reference voltage signal, a power terminal of the operation amplifier unit is connected with a second conductive end of the first conductive device, and the operation amplifier unit is configured to amplify and output the supply voltage of the display panel according to the power driving signal.

In the embodiment of the present disclosure, the supply voltage of the display panel is compensated and output through the operational amplifying device, such that the $V_{COM}$ voltage in the display panel may be always kept within the stable voltage amplitude range, the $V_{COM}$ voltage in the display panel may be prevented from being pulled when the scanning line and the data line are disconnected; the compensated $V_{COM}$ voltage in the present disclosure can enable the display panel to work under the normal working state, the display panel may display complete and clear videos/images, and good viewing experience is brought to the user; and the problem that the supply voltage enhancement circuit in the exemplified technology cannot enable enhanced $V_{COM}$ voltage to meet the requirement of reaching the rated power input of the display panel.

BRIEF DESCRIPTION OF THE DRAWINGS

In order to explain this embodiments of the present disclosure more clearly, a brief introduction regarding the accompanying drawings that need to be used for describing the embodiments is given below; it is obvious that the accompanying drawings described as follows are only some embodiments of the present disclosure, for ordinarily skilled one in the art, other drawings can also be obtained according to the current drawings on the premise of paying no creative labor.

DESCRIPTION OF THE EMBODIMENTS

In order to make the purpose, the technical solution and the advantages of the present disclosure be clearer and more understandable, the present disclosure is further described in detail below with reference to accompanying figures and embodiments. It should be understood that the specific embodiments described herein are merely intended to illustrate but not to limit the present disclosure.

It needs to be noted that, when it is described that one component "is fixed to" or "is arranged on" another component, this component may be directly or indirectly "fixed to" or "arranged on" another component. When it is described that one component is connected with another component, this component may be directly or indirectly connected on another component.

In the description of the present disclosure, it needs to be understood that, directions or location relationships indicated by terms such as "up", "down", "left", "right", and so on are the directions or location relationships shown in the accompanying figures, which are only intended to describe the present disclosure conveniently, but not to indicate or imply that an indicated device or component must have specific locations or be constructed and manipulated according to specific locations; therefore, these terms shouldn't be interpreted as limitation to the present disclosure. For ordinarily skilled one in the art, the specific meanings of the aforementioned terms may be interpreted according to specific conditions. Terms of "the first" and "the second" are only used in describe purposes, and should not be interpreted as indicating or implying any relative importance, or impliedly indicating the number of indicated technical features. The term of "a plurality of" means two or more, unless there is additional explicit and specific limitation.

In order to describe the technical solution of the present disclosure, the present disclosure will be described in detail with reference to specific accompanying figures and embodiments.

Figure 1:
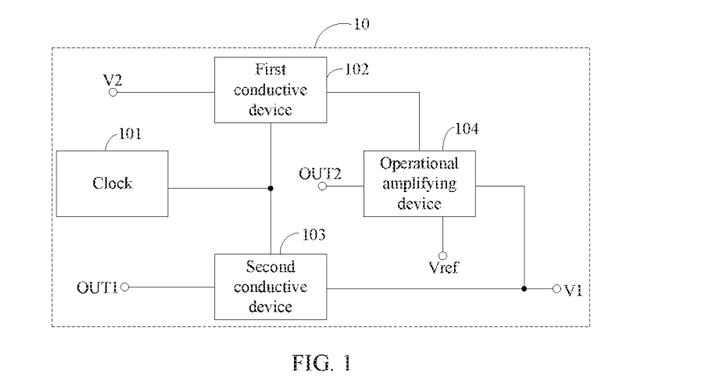
FIG. 1 illustrates a modular structure diagram of a supply voltage control circuit of one display panel provided by an embodiment of the present disclosure.

FIG. 1 illustrates a modular structure diagram of a supply voltage control circuit 10 of a display panel according to an embodiment of the present disclosure, in order to describe conveniently, a part related to the embodiment of the present disclosure is shown and is described in detail as follows:

as shown in FIG. 1, in this embodiment, the supply voltage control circuit 10 includes: a clock 101, a first conductive device 102, a second conductive device 103 and an operational amplifying device 104.

In this embodiment, the clock 101 is configured to generate a clock signal.

In this embodiment, the clock 101 may generate clock signals with different level states, so that the supply voltage control circuit 10 may implement different $V_{COM}$ voltage compensation functions through the clock signals, and is high in controllability; the working state of the supply voltage control circuit 10 is controlled through the control of the clock 101, according to the clock 101, the supply voltage control circuit 10 may be enabled to play an optimal $V_{COM}$ voltage compensation function, and thus has extremely high practical value.

In this embodiment, a first conductive end of the first conduction unit 102 is connected with a power supply V2, a control terminal of the first conductive device 102 is connected with the clock 101, the first conductive device 102 is turned on or turned off according to the clock signal, and a power driving signal is generated when the first conductive device 102 is turned on.

In this embodiment, the first conductive device 102 may be controlled to be turned on or turned off according to the clock signal generated by the clock 101; if the $V_{COM}$ voltage of the display panel is pulled, the first conductive device 102 may be turned on immediately through the clock signal; the power supply V2 may output stable electric energy to the first conductive device 102, and then the first electric conduction unit 102 generates a power driving signal according to the electric energy in the power supply V2 and outputs the power driving signal to the operation amplifier unit 104 through the second conductive end of the first conductive device 102; the power driving signal may drive the supply voltage control circuit 10 to realize the $V_{COM}$ voltage compensation function, so that the working state of the supply voltage control circuit 10 may be adjusted through the power driving signals; at the time when a data line and a scanning line in the display panel are turned off, the first conductive device 102 is turned on, so that the $V_{COM}$ voltage in the display panel can be prevented from being greatly reduced through the power driving signal, and it is guaranteed that the $V_{COM}$ voltage in the display panel may be always in a rated power supply state.

In this embodiment, second conductive device a control terminal of the second conductive device 103 is connected with the clock 101, a first conductive end of the second conductive device 103 is connected with the supply voltage output V1 of the display panel, a second conductive end of the second conductive device 103 is a first voltage output OUT1 of the supply voltage control circuit 10, the second conductive device 103 is turned on or off according to the clock signal.

In this embodiment, when the clock 101 outputs the clock signal to the second conductive device 103, the second conductive device 103 may be controlled to be turned on or off through the clock signal; in combination with what described above, if the $V_{COM}$ voltage in the display panel is pulled, the first conductive device 102 is turned on through the clock signal, and the second conductive device 103 is turned off, at this moment, the power driving signal is generated through the first conductive device 102, the supply voltage control circuit 10 may amplify and output the $V_{COM}$ voltage according to the power driving signal, so that an abnormal condition of video display effect of the display panel is prevented; if the $V_{COM}$ voltage in the display panel is not pulled, the first conductive device 102 is turned off through the clock signal, and the second conductive device 103 is turned on, the first electric conduction unit 102 generates the power driving signal, at this moment, the supply voltage control circuit 10 fails to play the function of $V_{COM}$ voltage compensation, since the second conductive device 103 is turned on, so that the supply voltage output V1 of the display panel directly outputs the $V_{COM}$ voltage through the second conductive device 103. In this embodiment, due to the fact that the $V_{COM}$ voltage in the display panel is in a normal state, the $V_{COM}$ voltage needs not to be compensated, the $V_{COM}$ voltage may be directly output through the second conductive end of the second conductive device 103, so that the supply voltage control circuit 10 may be enabled to be in different working state according to the control of on and off state of the first conductive device 102 and the second conductive device 103 in this embodiment, not only can the $V_{COM}$ voltage in the display panel may be always kept in a rated amplitude range, but also the working efficiency of the supply voltage control circuit 10 can be improved, and too complex voltage compensation procedure in the supply voltage control circuit 10 is prevented, the supply voltage control circuit 10 in this embodiment is simpler and more convenient in operation.

In this embodiment, operational amplifying device a first input of the operational amplifying device 104 is connected with the supply voltage output V1 of the display panel, a second input of the operational amplifying device 104 is connected with a reference voltage signal Vref, a power terminal of the operational amplifying device 104 is connected with a second conductive end of the first conductive device 102, the operational amplifying device 104 is configured to amplify and output the supply voltage of the display panel according to the power driving signal.

In this embodiment, two input terminals (i.e., a first input and a second input) of the operational amplifying device 104 access different voltage signals respectively, and the operational amplifying device 104 may achieve a differential amplification function on two paths of input signals, so that the $V_{COM}$ voltage of the display panel may be compensated and amplified through the operational amplifying device 104 in this embodiment; besides, an output of the operational amplifying device 104 serves as a second voltage output OUT2 of the supply voltage control circuit 10, the amplified $V_{COM}$ voltage may be output to the display panel through the second voltage output OUT2, such that a normal display state may be realized by driving pictures of the display panel; in particular, when a second conductive end of the first conduction unit 102 outputs the power driving signal to the power terminal of the operational amplifying device 104, the $V_{COM}$ voltage of the display panel is pulled, the power driving signal may activate a differential amplification function of the operational amplifying device 104, the $V_{COM}$ voltage of the display panel may be amplified and output through the operational amplifying device 104, such that the $V_{COM}$ voltage of the display panel may be returned to a normal amplitude range; when the second conductive end of the first conduction unit 102 fails to output the power driving signal to the operational amplifying device 104, it means that the $V_{COM}$ voltage of the display panel is not pulled, the operational amplifying device 104 stops working, the supply voltage control circuit 10 does not play the $V_{COM}$ voltage compensation function, at this moment, the first voltage output OUT1 of the supply voltage control circuit 10 may directly output $V_{COM}$ voltage of the display panel; therefore, in this embodiment, the working state of the operational amplifying device 104 may be controlled through the power driving signal, the operation is simple and convenient, the $V_{COM}$ voltage of the display panel may be compensated through the operational amplifying device 104, such that the display panel can obtain the $V_{COM}$ voltage with a normal amplitude, the display panel has normal and clear video display effect all the time, and good viewing experience is brought to the user.

In this embodiment, the $V_{COM}$ voltage in the display panel may be monitored and amplified through the four circuit modules, the circuit structure is extremely high in flexibility and is strong in compatibility; when the $V_{COM}$ voltage in the display panel is not pulled, the $V_{COM}$ voltage may be output directly through the first voltage output OUT1 of the supply voltage control circuit 10, the supply voltage control circuit 10 does not play the role of compensating and amplifying the $V_{COM}$ voltage, the supply voltage control circuit 10 has extremely high power supply compensation efficiency; when the $V_{COM}$ voltage in the display panel is pulled, the power driving signal may drive the operational amplifying device 104 to achieve the function of differential amplification, the $V_{COM}$ voltage may be compensated and amplified through the supply voltage control circuit 10, so that the compensated and amplified $V_{COM}$ voltage may enable the pictures in the display panel to displayed normally, and a phenomenon that images of the display panel is displayed abnormally due to the fact that the $V_{COM}$ voltage is pulled is avoided, and the viewing experience of the user is greatly enhanced; moreover, the supply voltage control circuit 10 in this embodiment uses a circuit module to compensate and output the $V_{COM}$ voltage according to an actual working condition of the display panel, the compensated $V_{COM}$ voltage may meet the requirement of reaching the rated working power in the display panel, and a problem that a supply voltage enhancement circuit cannot enable the enhanced $V_{COM}$ voltage to reach the rated input power supply standard of the display panel in the exemplary technology, such that the display quality of images in the display panel is poor is solved.

Meanwhile, since the capability of compensation and amplification of the $V_{COM}$ voltage of the operational amplifying device 104 may be adjusted according to a specific type of the display panel in this embodiment, such that the supply voltage control circuit 10 may be applied in various types of display panels, and the $V_{COM}$ voltage in the display panel is improved correspondingly, the compatibility is extremely high, the operation is simple and convenient, and a problem that a traditional supply voltage enhancement circuit can only be applied to a specific type of display panel which has a narrow application range and has a low practical value is solved.

As an optional implementation mode, when the clock signal is in a first level state, the first conductive device 102 is turned on and the second conductive device 103 is turned off.

When the clock signal is in a second level state, the first conductive device 103 is turned off and the second conductive device 103 is turned on.

Optionally, the first level of the clock signal may be either in a high level state or in a low level state, it is not limited herein, and phases of the first level state and the second level state of the clock signal are staggered; exemplarily, when the first level state of the clock signal is the high level state, the second level state of the clock signal is the low level state.

In this embodiment, on state and off state of the first conductive device 102 and the second conductive device 103 are determined through a level state of the clock signal, when the scanning line or the data line in the display panel is turned off, and when the $V_{COM}$ voltage is pulled, the clock signal generated by the clock 101 is in the first level state, such that the supply voltage control circuit 10 may be driven to implement the voltage amplification function to amplify the $V_{COM}$ voltage of the display panel through the clock signal, and an abnormal image effect in the display panel is avoided; when the $V_{COM}$ voltage in the display panel is within the normal amplitude range, the clock signal generated by the clock 101 is in the second level state, the first conductive device 102 is turned off through the clock signal, and the second conductive device 103 is enabled to be turned on, at this time, the supply voltage control circuit 10 does not implement compensation and amplification operation of the $V_{COM}$ voltage, the $V_{COM}$ voltage of the display panel may be output directly through the first voltage output OUT1 of the supply voltage control circuit 10, normal display of videos/images in the display panel may be guaranteed through the $V_{COM}$ voltage, and the control efficiency of the supply voltage control circuit 10 may be improved through the clock signal. Therefore, a voltage compensation capability of the supply voltage control circuit 10 may be changed in real time through the level state of the clock signal in this embodiment, the operation is simple and convenient, and a controllability of the supply voltage control circuit 10 is high, the display panel may be provided with rated $V_{COM}$ voltage through the supply voltage control circuit 10. In this embodiment, the quality of image display in the display panel is improved, and good use experience is brought to the user.

Figure 2:
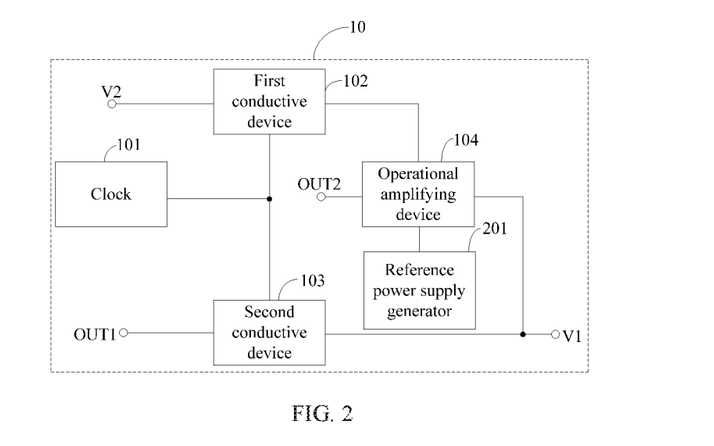
FIG. 2 illustrates a modular structure diagram of a supply voltage control circuit of another display panel provided by an embodiment of the present disclosure.

As an optional implementation mode, FIG. 2 illustrates another modular structure of the supply voltage control circuit 10 of the display panel provided by this embodiment, as compared to the supply voltage control circuit 10 in FIG. 1, the supply voltage control circuit 10 in FIG. 2 further includes a reference voltage generator 201; the reference voltage generator 201 is connected between the second input of the operational amplifying device 104 and GND (ground), the reference voltage generator 201 is configured to generate a reference voltage signal Vref and output the reference voltage signal Vref to the operational amplifying device 104; the reference voltage signal Vref may provide reference voltage information to the operational amplifying device 104, when the operational amplifying device 104 is connected to the $V_{COM}$ voltage of the display panel and the reference voltage signal Vref, the operational amplifying device 104 achieves the differential amplification function of the $V_{COM}$ voltage according to the difference between the $V_{COM}$ voltage and the reference voltage signal Vref; when the $V_{COM}$ voltage in the display panel is pulled, the $V_{COM}$ voltage of the display panel may be compensated and amplified and output through the operational amplifying device 104; so that the supply voltage control circuit 10 may achieve a normal circuit function, and it is guaranteed that the $V_{COM}$ voltage of the display panel is continuously in the rated power range of the display panel according to the reference voltage generator 201 in this embodiment.

Figure 3:
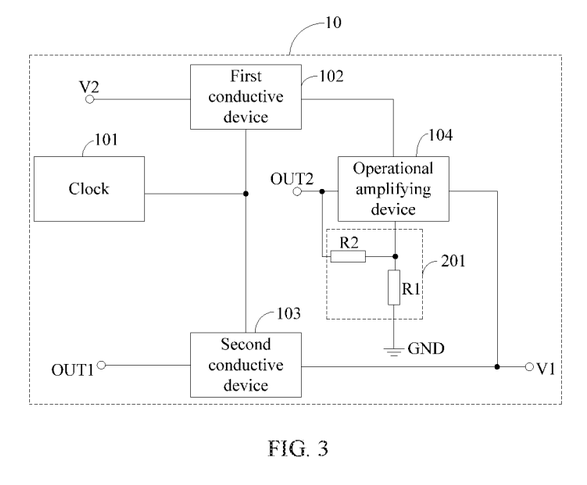
FIG. 3 illustrates a circuit configuration diagram of one reference voltage generator provided by an embodiment of the present disclosure.

As an optional implementation mode, FIG. 3 illustrates a circuit structure of the reference voltage generator 201 provided by this embodiment, as shown in FIG. 3, the reference voltage generator 201 includes a first resistor R1 and a second resistor R2, where a first end of the first resistor R1 and a second end of the second resistor R2 are in common connection with a second input of the operational amplifying device 104, a second end of the first resistor R1 is grounded, and a second end of the second resistor R2 is connected with an output of the operational amplifying device 104.

In this embodiment, the reference voltage signal Vref may be provided to the operational amplifying device 104 through the first resistor R1 and the second the resistor R2, so that the reference voltage generator 201 in this embodiment has more simplified circuit structure and lower circuit manufacturing cost, stable and safe operation of the operational amplifying device 104 may be ensured through the reference voltage signal generated by the reference voltage generator 201; besides, the circuit structure of the reference voltage generator 201 has high compatibility, which facilitates broadening an application range of the supply voltage control circuit 10.

Figure 4:
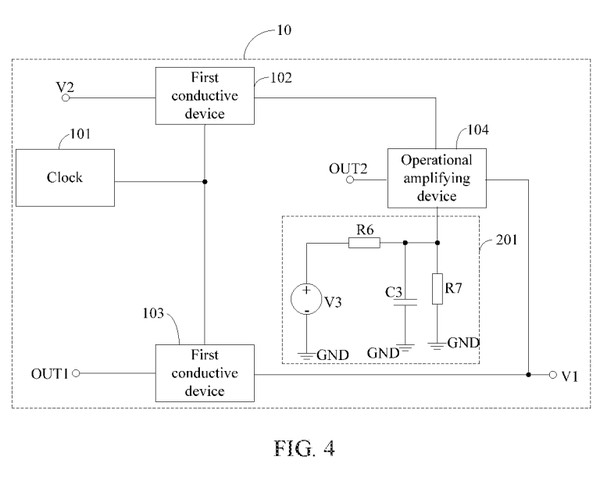
FIG. 4 illustrates a circuit configuration diagram of another reference voltage generator provided by an embodiment of the present disclosure.

As an optional implementation mode, FIG. 4 illustrates another circuit structure of the reference voltage generation device 201 according to the embodiment of the present disclosure. As shown in FIG. 4, where the reference voltage generator 201 includes a reference voltage source V3, a sixth resistor R6, a seventh resistor R7 and a third capacitor C3.

In the specific circuit structure of the reference voltage generator 201 shown in FIG. 4, a first end of the sixth resistor R6, a first end of the seventh resistor R7 and a first end of the third capacitor C3 are connected with the second input of the operational amplifying device 104, a second end of the seventh resistor R7 is grounded, a second end of the third capacitor C3 is grounded, a positive electrode of the reference voltage source V3 is connected with a second end of the sixth resistor R6 and a negative electrode of the reference voltage source V3 is grounded.

As an optional implementation mode, the reference voltage source V3 is a +5V DC (Direct Current) power supply; so that the reference voltage generator 201 generates the reference voltage signal Vref through the reference voltage source V3, and the amplitude of the reference voltage signal Vref may be adjusted in real time, such that the operational amplifying device 104 may achieve the function of voltage amplification stably; the reference voltage generator 201 in this embodiment has very simplified circuit structure, ensures safe and stable operation of the supply voltage control circuit 10, and has stronger compatibility.

Figure 5:
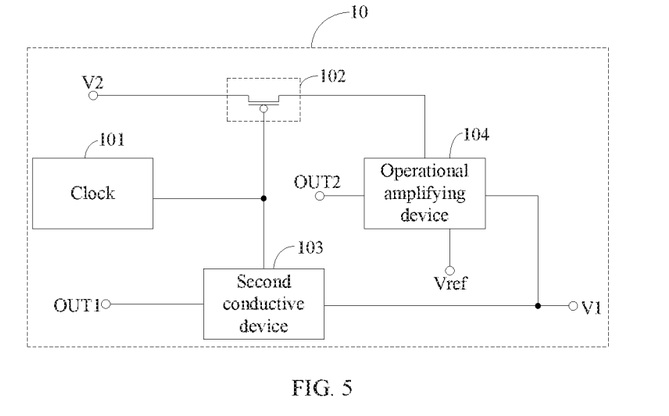
FIG. 5 illustrates a circuit configuration diagram of a first conductive device provided by an embodiment of the present disclosure.

As an optional implementation mode, FIG. 5 illustrates a circuit structure of the first conductive device 102 provided by this embodiment, as shown in FIG. 5, the first conductive device 102 includes a first switching transistor; where a control electrode of the first switching transistor is connected with the clock 101, a first conductive electrode of the first switching transistor is connected with a power supply V2, a second conductive electrode of the first switching transistor is connected with a power terminal of the operational amplifying device 104.

In this embodiment, turning on or turning off of the first conductive device 102 may be implemented through the first switching transistor, when the clock 101 outputs the clock signal to the control electrode of the first switching transistor, and when the clock signal has different level states, a wiring between the first conductive electrode and the second conductive electrode of the first switching transistor may be turned on or off; when the wiring between the first conductive electrode and the second conductive electrode of the first switching transistor is conductive, the second conductive electrode of the first switching transistor outputs the power driving signal to the operational amplifying device 104, so that the operational amplifying device 104 may be driven to realize the voltage amplification function through the power driving signal to ensure that the $V_{COM}$ voltage in the display panel is in a rated power supply state; therefore, the power driving signal is generated accurately and fast through the first switching transistor in this embodiment, and a signal processing speed of the supply voltage control circuit 10 is improved.

In this embodiment, optionally, the first switching transistor is a MOS (Metal Oxide Semiconductor) transistor or a triode; exemplarily, the first switching transistor is the MOS transistor, a grid electrode of the MOS transistor is connected with the clock 101, and a first conductive electrode of the MOS transistor is connected with the power supply V2, a second conductive electrode of the MOS transistor is connected with the power terminal of the operational amplifying device 104; when the clock 101 outputs the clock signal to the gate electrode of the MOS transistor, the MOS transistor may be controlled to be turned on or off through the clock signal, the power driving signal may be generated through the MOS transistor, and the circuit structure of the first conductive device 102 is greatly simplified.

As an optional embodiment, where the first conductive device 102 includes a plurality of cascaded switching transistors; in the plurality of cascaded switching transistors, a second conductive electrode of a previous switching transistor is connected with a first conductive electrode of a next switching transistor, a first conductive electrode of the first switching transistor is connected with the power supply V2, and a second conductive electrode of the last switching transistor is connected with the power terminal of the operational amplifying device 104, and a control electrode of each switching transistor is connected with the clock 101.

Therefore, in this embodiment, the first conductive device 102 uses a plurality of switching transistors to achieve on-off control function of a circuit, so that the stability is higher, and an interference of external noise to the working state of the first conductive device 102 is avoided.

Figure 6:
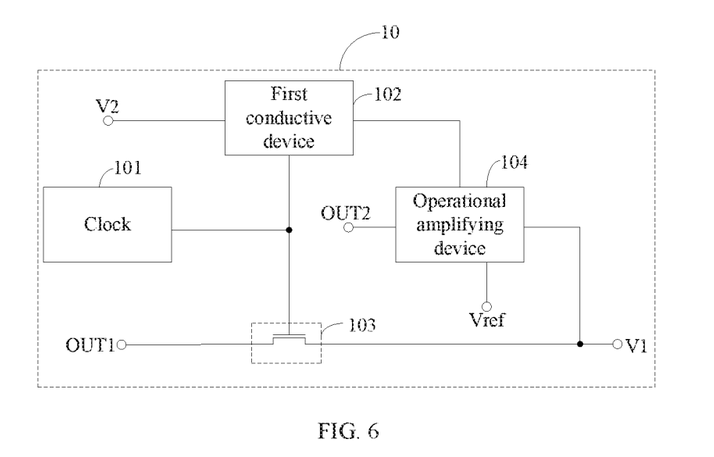
FIG. 6 illustrates a circuit configuration diagram of a second conductive device provided by an embodiment of the present disclosure.

As an optional embodiment, FIG. 6 illustrates a circuit structure of the second conductive device 103 provided by this embodiment, as shown in FIG. 6, the second conductive device 103 includes a second switching transistor; where a control electrode of the second switching transistor is connected with the clock 101, a first conductive electrode of the second switching transistor is connected with the power supply voltage output V1 of the display panel, and the second conductive electrode of the second switching transistor is the first voltage output OUT1 of the supply voltage control circuit 101.

In this embodiment, the clock 101 outputs the clock signal to the control electrode of the second switching transistor to enable the second switching transistor be turned on through the clock signal when the $V_{COM}$ voltage of the display panel is not pulled, the wiring between the first conductive electrode and the second conductive electrode of the second switching transistor is equivalent to short circuit, the supply voltage output of the display panel directly outputs the $V_{COM}$ voltage through the first conductive electrode of the second switching transistor tube and the second conductive electrode of the second switching transistor; at this moment, the first input of the operational amplifying device 104 cannot be connected with the $V_{COM}$ voltage, the operational amplifying device 104 stops working, the supply voltage control circuit 10 fails to implement amplification and compensation function on the $V_{COM}$ voltage of the display panel, the $V_{COM}$ voltage may be output directly through the first voltage output OUT1 of the supply voltage control circuit 10, even through the $V_{COM}$ voltage of the display panel is not compensated and amplified, a normal display of videos in the display panel may be maintained; therefore, a control efficiency of the supply voltage control circuit 10 may be improved through the second switching transistor, and the definition of videos/images in the display panel is guaranteed in this embodiment.

As an optional implementation mode, the second switching transistor is a MOS transistor or a triode; the second switching transistor is a MOS transistor, a grid electrode of the MOS transistor is connected with the clock 101, a first conductive electrode of the MOS transistor is connected with the supply voltage output V1 of the display panel, the second conductive electrode of the MOS transistor is the first voltage output OUT1 of the supply voltage control circuit 10; when the clock 101 outputs the clock signal to the grid electrode of the MOS transistor, the MOS transistor is turned on through the clock signal, so that the supply voltage output V1 of the display panel may directly output the $V_{COM}$ voltage through the MOS transistor, not only the circuit structure of the supply voltage control circuit 10 is simplified, but also the control efficiency of the supply voltage control circuit 10 is improved.

As an optional embodiment, where the second conductive device 103 includes a plurality of cascaded switching transistors; in the plurality of cascaded switching transistors, a second conductive electrode of a previous switching transistor is connected with a first conductive electrode of a next switching transistor, a first conductive electrode of the first switching transistor is connected with the supply voltage output V1, and a second conductive electrode of the last switching transistor is the first voltage output OUT1 of the supply voltage control circuit 10, and a control electrode of each switching transistor is connected with the clock 101.

Therefore, the working stability of the second conductive device 103 is improved through the plurality of cascaded switching transistors, so that the supply voltage control circuit 10 may be kept in an optimal working state, the $V_{COM}$ voltage of the display panel may be amplified and output in time.

Therefore, in combination with the abovementioned embodiments, in the supply voltage control circuit 10, turning on or off of the first conductive device 102 and the second conductive device 103 may be implemented through the switching transistors, the compatibility of the circuit is extremely high; moreover, the first conductive device 102 and the second conductive device 103 have completely opposite conductivity polarities, if the first conductive device 102 is turned on, the second conductive device 103 is turned off; otherwise, if the first conductive device 102 is turned off, the second conductive device 103 is turned on; thus, the $V_{COM}$ voltage may be amplified through conductivity and non-conductivity between the first conductive device 102 and the second conductive device 103, the operation is simple and convenient, and a capability of the supply voltage control circuit 10 in the aspect of $V_{COM}$ voltage compensation of the display panel is greatly improved.

Figure 7:
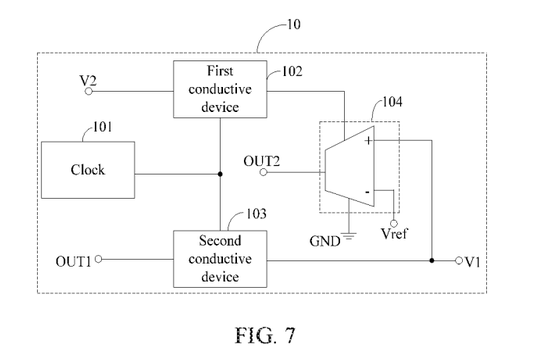
FIG. 7 illustrates a circuit configuration diagram of one operational amplifying device provided by an embodiment of the present disclosure.

As an optional implementation mode, FIG. 7 illustrates a circuit structure of the operational amplifying device 104 provided by this embodiment, as shown in FIG. 7, the operational amplifying device 104 includes an operational amplifier, where a first input of the operational amplifier is connected with the power supply voltage output V1 of the display panel, a second input of the operational amplifier is connected with a reference voltage signal Vref, a power terminal of the operational amplifier is connected with the second conductive end of the first conductive device 102, and an output of the operational amplifier is a second voltage output OUT2 of the supply voltage control circuit 10.

Optionally, the first input of the operational amplifier can either be a non-inverting input of the operational amplifier or be an inverting input of the operational amplifier; exemplarily, when a first input of the operational amplifier is a non-inverting input, the second input of the operational amplifier is an inverting input.

In this embodiment, since the power terminal of the operational amplifier is connected to the second conductive end of the first conductive device 102, the ground terminal of the operational amplifier is connected with GND, the working state of the operational amplifier may be controlled through the power driving signal, the operational amplifier may be driven to be in the normal working state through the power driving signal only when the first conductive device 102 outputs the power driving signal to the operational amplifier; when the power driving signal is not output to the operational amplifier by the first conductive device 102, the operational amplifier stops working; therefore, when the $V_{COM}$ voltage of the display panel is pulled, the reference voltage signal Vref and the $V_{COM}$ voltage are connected by the first input and the second input of the operational amplifier respectively; the operational amplifier performs differential amplification on the $V_{COM}$ voltage and outputs the $V_{COM}$ voltage according to the difference between the reference voltage signal Vref and the $V_{COM}$ voltage, thus, the second voltage output OUT2 of the supply voltage control circuit 10 may output the amplified $V_{COM}$ voltage to the display panel, and the display panel is provided with the rated power supply through the amplified $V_{COM}$ voltage, so that the display panel may display normal and clear videos/images. Therefore, in this embodiment, the operation amplifier is configured to accurately amplify and output the $V_{COM}$ voltage of the display panel, so that the amplified $V_{COM}$ voltage output by the operational amplifier may meet the requirement of the rated power input of the display panel, it may be guaranteed that the $V_{COM}$ voltage of the display panel be effectively kept within the normal amplitude range through the operational amplifier, the controllability of the supply voltage control circuit 10 is improved, and the problem that pictures are abnormally displayed due to the fact that the $V_{COM}$ voltage of the display panel pulled is avoided, so that the supply voltage control circuit 10 in this embodiment has extremely high practical value.

As an optional embodiment, the operational amplifying device 104 includes a comparator; where a first input of the comparator is connected with the power supply voltage output V1 of the display panel, a second input of the comparator is connected with the reference voltage signal Vref, a power terminal of the comparator is connected with the second conductive end of the first conductive device 102, and the output of the comparator is the second voltage output OUT2 of the supply voltage control circuit 10.

Optionally, a first input of the comparator can either be a non-inverting input or be an inverting input, exemplarily, a first input of the comparator is the non-inverting input, a second input of the comparator is the inverting input; a voltage amplification function of the comparator may be controlled through the power driving signal, the comparator may be driven to realize voltage comparison and amplification function through the power driving signal only when the power terminal of the comparator is connected with the power driving signal; when the first input and the second input of the comparator are connected with the reference voltage signal and $V_{COM}$ voltage respectively, the $V_{COM}$ voltage of the display panel may be amplified and output through the comparator, so that the amplified $V_{COM}$ voltage may be output to the display panel through the output of the comparator, such that the display panel may display normal and stable images/videos, and good viewing experience is brought to the user; thus, in this embodiment, the $V_{COM}$ voltage of the display panel may be always maintained in the normal amplitude range using the comparator, the circuit has a simple structure and is extremely high in compatibility, and the application range of the supply voltage control circuit 10 is effectively broadened.

Figure 8:
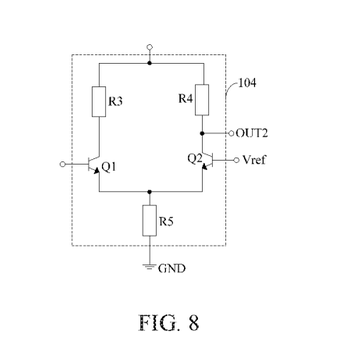
FIG. 8 illustrates a circuit configuration diagram of another operational amplifying device provided by an embodiment of the present disclosure.

As an optional implementation mode, FIG. 8 illustrates another circuit structure of the operational amplifying device 104 provided in this embodiment, as shown in FIG. 8, the operational amplifying device 104 includes a third resistor R3, a fourth resistor R4, a fifth resistor R5, a first triode Q1 and a second triode Q2.

A first end of the third resistor R3 and a first end of the fourth resistor R4 are in common connection to form the power terminal of the operational amplifying device 104, a second end of the third resistor R3 is connected with a collector electrode of the first triode Q1, a second end of the fourth resistor R4 is connected with the collector electrode of the second triode Q2, an emitting electrode of the first triode Q1 and an emitting electrode of the second triode Q2 are in common connection with a first end of the fifth resistor R5, and a second end of the fifth resistor R5 is connected with GND; a base electrode of the first triode Q1 is a first input of the operational amplifying device 104, a base electrode of the second triode Q2 is a second input of the operational amplifying device 104, a second end of the fourth resistor R4 and a collector electrode of the second triode Q2 are in common connection to form an output of the operational amplifying device 104.

In this embodiment, when the base electrode of the first triode Q1 is connected with the $V_{COM}$ voltage of the display panel, the base electrode of the second triode Q2 is connected with the reference voltage signal Vref, differential amplification may be performed on the $V_{COM}$ voltage and the reference voltage signal Vref through the first triode Q1 and the second triode Q2 respectively, so that the output of the operational amplifying device 104 may output the $V_{COM}$ voltage after differential amplification; thus, in this embodiment, an accurate $V_{COM}$ voltage amplification function is implemented through the operational amplifying device 104 having very simplified circuit structure and the practical value is extremely high.

Figure 9:
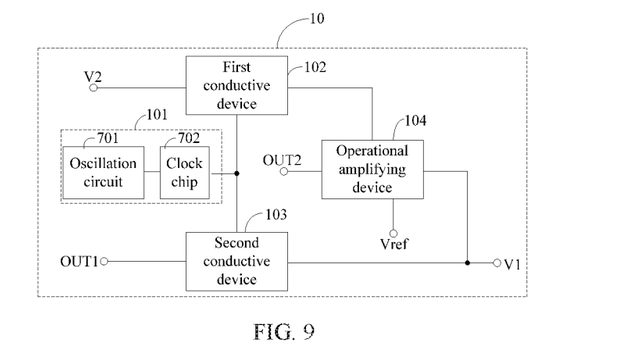
FIG. 9 illustrates a modular structure diagram of a clock provided by an embodiment of the present disclosure.

As an optional embodiment, FIG. 9 illustrates a module structure of a clock 101 provided in this embodiment, as shown in FIG. 9, the clock 101 includes an oscillation circuit 701 and a clock chip 702.

In this embodiment, the oscillation circuit 701 is configured to generate an oscillation signal.

In this embodiment, the oscillation circuit 701 may generate a corresponding oscillation signal according to a voltage amplitude of the $V_{COM}$ voltage in the display panel, where an oscillation frequency may be provided to the clock chip 702 through the oscillation signal; when the voltage amplitude of the $V_{COM}$ voltage of the display panel is changed, the oscillation signal have different oscillation frequencies, and then the working state of the clock 101 may be adjusted through the oscillation signal, such that an optimal compensation effect of the $V_{COM}$ voltage of the display panel may be achieve by the supply voltage control circuit 10, and the controllability of the supply voltage control circuit 10 is improved.

Figure 10:
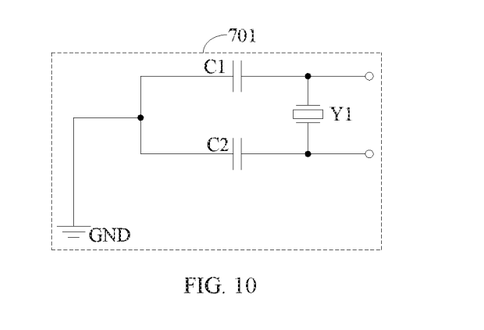
FIG. 10 illustrates a circuit configuration diagram of an oscillation circuit provided by an embodiment of the present disclosure.

As an optional implementation mode, FIG. 10 illustrates a circuit structure of the oscillation circuit 701 provided in this embodiment, as shown in FIG. 10, the oscillation circuit 701 includes a first capacitor C1, a second capacitor C2 and a first crystal oscillator Y1; where a first end of the first capacitor C1 and a first end of the second capacitor C2 are in common connection with the ground GND, a second end of the first capacitor C1 and a second end of the first crystal oscillator Y1 are connected to form a second oscillation signal output of the oscillation circuit 701, where a first oscillation signal output of the oscillation circuit 701 and a second oscillation signal output of the oscillation circuit 701 are connected with a clock chip 701; when the first crystal oscillator Y1 generates oscillation signals having different oscillation frequencies, the oscillation signals are output to the clock chip 702 through the first oscillation signal output and the second oscillation signal output of the oscillation circuit 701, the clock 701 may be driven to generate clock signals with different level states through the oscillation signals; thus, the oscillation circuit 701 in this embodiment may generate corresponding clock signals through its simplified circuit structure to drive the supply voltage control circuit 10 to realize the corresponding $V_{COM}$ voltage compensation function, such that the display panel may display normal and clear images/videos.

In this embodiment, the oscillation signal input/output pin of the clock chip 702 is connected with the oscillation circuit 701, and the clock chip 702 is configured to generate a clock signal.

As an optional implementation mode, the model of the clock chip 702 is DS1302 or SD2201; various types of clock chips 702 may be applied in the clock chip 702 in this embodiment, such that the clock 101 generates the corresponding clock signal, the clock chip 702 in this embodiment may achieve more complex signal conversion function and has extremely high compatibility.

In this embodiment, when the oscillation circuit 701 outputs oscillation signals to the clock chip 702, since the oscillation signals have different oscillation frequencies, the clock chips 702 may be driven to be in different working states through the oscillation signals; exemplarily, the oscillation circuit generates an oscillation signal when the $V_{COM}$ voltage in the display panel is pulled, the oscillation signal provides a corresponding oscillation frequency to the clock chip 702, such that the clock chip 702 generates a clock signal with a specific level state, and the supply voltage control circuit 10 may be driven to amplify and output the $V_{COM}$ voltage of the display panel through the clock signal, so that the $V_{COM}$ voltage of the display panel may be within the rated amplitude range; thus, in this embodiment, the clock signal may be quickly generated by the oscillation circuit 701, and a problem that the $V_{COM}$ voltage of the display panel is pulled for a long time due to the fact that the scanning line and the data line in the display panel are suddenly closed is avoided.

According to the modular structure of the clock 101 shown in FIG. 9, the clock 101 generates a corresponding clock signal through the oscillation circuit 701 and the clock chip 702, the circuit structure is simple, and the ordinarily skilled one in the art may select a specific model of the clock chip 702 according to actual need, the circuit structure is high in flexibility; therefore, the clock 101 in this embodiment may guarantee that the supply voltage control circuit 10 has corresponding voltage compensation function, and the definition and the stability of videos/images displayed in the display panel are improved.

Figure 11:
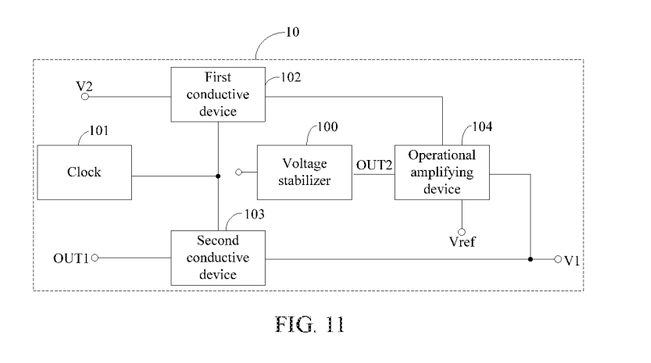
FIG. 11 illustrates a modular structure diagram of a supply voltage control circuit of another display panel provided by an embodiment of the present disclosure.

As an optional implementation mode, FIG. 11 illustrates another modular structure of the supply voltage control circuit 10 of the display panel provided in this embodiment, as compared to the modular structure of the supply voltage control circuit 10 shown in FIG. 1, the supply voltage control circuit 10 of the display panel in FIG. 11 further includes a voltage stabilizer 100.

The stabilization unit 100, the voltage stabilizer 100 is connected with an output of the operational amplifying device 104 and performs a voltage stabilization on the amplified supply voltage of the display panel.

Figure 12:
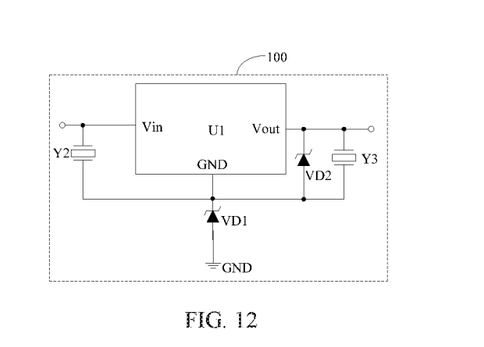
FIG. 12 illustrates a circuit configuration diagram of a voltage stabilizer provided by an embodiment of the present disclosure.

As an optional implementation mode, FIG. 12 illustrates a concrete circuit structure of the voltage stabilizer 100 provided by this embodiment, as shown in FIG. 12, the stabilization unit 100 includes a voltage stabilization chip U1, a second crystal oscillator Y2, a third crystal oscillator Y3, a first zener diode YD1, a second zener diode YD2; where the power input pin Vin and a first end of the second crystal oscillator Y1 are in common connection with a voltage input of the voltage stabilizer 100, a first end of the third crystal oscillator Y3, an anode of the second zener diode YD2 and a power output pin Vout of the voltage stabilization chip U1 are in common connection to form a voltage output of the voltage stabilizer 100, a second end of the second crystal oscillator Y2, a cathode of the first voltage stabilization diode VD1, an anode of the second voltage stabilization diode VD2 and a second end of the third crystal oscillator Y3 are in common connection with a GND pin of the voltage stabilization chip U1, an anode of the first voltage stabilization diode VD1 is grounded, a voltage input of the voltage stabilizer 100 is connected with the output of the operational amplifying device 104.

As an optional implementation mode, the model of the voltage stabilization chip U1 is LM 2940CT series chip or LMC2930T series chip; thus, the voltage stabilizing unit 100 in this embodiment utilizes the voltage stabilizing chip U1 to achieve the $V_{COM}$ voltage stabilization function of the display panel, an operation safety of the display panel is improved, so that the display panel may display a more complete and clearer images/videos.

As an optional implementation mode, the embodiment provides a display panel, where the display panel includes at least one scanning line, at least one data line and a grid electrode driver, a source electrode driver and a supply voltage control circuit for the display panel.

The at least one scanning line is vertically arranged in array.

The at least one data line is horizontally arranged in array.

The gate driver is connected with the scanning line and is configured to generate a scanning signal.

The source driver is connected with the data line and is configured to generate a data signal;

The supply voltage control circuit for the display panel is connected with the scanning line and the data line, where the supply voltage control circuit includes a clock, a first conductive device, a second conductive device and an operational amplifying device.

The clock is configured to generate a clock signal.

A first conductive end of the first conductive device is connected with a power supply, a control end of the first conductive device is connected with the clock, the first conductive device is configured to be turned on or turned off according to the clock signal, and the first conductive device is configured to generate a power driving signal when being turned on.

A control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal.

A first input of the operational amplifying device is connected with the supply voltage output of the display panel, a second input of the operational amplifying device is connected with a reference voltage signal, a power terminal of the operation amplifier unit is connected with a second conductive end of the first conductive device, and the operation amplifier unit is configured to amplify and output the supply voltage of the display panel according to the power driving signal.

It needs to be noted that, in this embodiment, the gate electrode driver and the source electrode driver may be realized by adopting the specific circuit structure in the exemplary technology; The supply voltage control circuit for the display panel in this embodiment is the supply voltage control circuit 10 of the display panel in FIG. 1.

As an optional implementation mode, the supply voltage control circuit further includes:

a reference voltage generator connected between the second input of the operational amplifying device and GND and is configured to generate a reference voltage signal.

As an optional implementation mode, the supply voltage control circuit further includes:

a voltage stabilizer connected with the output of the operational amplifying device and is configured to perform voltage stabilization on the amplified supply voltage of the display panel.

Since the various circuit modules in the display panel of this embodiment correspond to the supply voltage control circuit 10 in FIGS. 1-12, regarding the specific implementation mode of the display panel in this embodiment, reference can be made to the embodiments shown in FIG. 1 to FIG. 12, and it is not repeatedly described herein.

Figure 13:
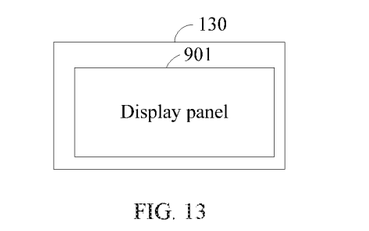
FIG. 13 illustrates a modular structure diagram of a display device provided by an embodiment of the present disclosure.

FIG. 13 illustrates a modular structure of a display device 130 provided in this embodiment, as shown in FIG. 13, the display device 130 includes a display panel 901, in this embodiment, regarding an internal circuit structure of the display panel 901 and the working principle thereof, reference can be made to the embodiments in FIGS. 1-12, and it is not repeatedly described herein; referring to embodiments in FIGS. 1-12, when the $V_{COM}$ voltage of the display panel 901 is pulled, the $V_{COM}$ voltage may be amplified and output through the supply voltage control circuit, the display panel 901 displays high-definition and normal images according to the amplified $V_{COM}$ voltage, good viewing experience is brought to the user; the supply voltage control circuit in this embodiment has more simplified circuit structure and is extremely high in compatibility, the supply voltage control circuit may enable the amplified $V_{COM}$ voltage to meet the requirement of rated power input of the display panel 901, the display device 130 displays high definition and dynamic videos according to the actual requirement of the user, and thus the display device 130 may be applicable in various industrial fields and has relatively high practical value, and a problem that image display effect in the display panel is abnormal and the viewing experience of the user is poor due to the fact that the $V_{COM}$ voltage of the display panel in the exemplary technology is pulled is solved.

As an optional embodiment, the aforesaid display device 130 is an LCD (Liquid Crystal Display), an OLED (Organic Light Emitting Diode) or a QLED (Quantum Dot Light Emitting Diode).

In combination with the contents described above, the supply voltage control circuit in the present disclosure has simplified circuit structure, is extremely high in compatibility, and may raise $V_{COM}$ voltage of the display panel timely, the display quality of the display panel is greatly improved, and good viewing experience is brought to the user; thus, the supply voltage control circuit in the present disclosure has an important positive significance for promoting the development of display technology.

What is claimed is:

1. A supply voltage control circuit for a display panel, comprising:
    a clock configured to generate a clock signal;
    a first conductive device, wherein a first conductive end of the first conductive device is connected with a power supply, a control end of the first conductive device is connected with the clock, and the first conductive device is configured to be turned on or turned off according to the clock signal and generate a power driving signal when being turned on;

a second conductive device, wherein a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and an operational amplifying device, wherein a first input of the operational amplifying device is connected with the supply voltage output of the display panel, a second input of the operational amplifying device is connected with a reference voltage signal, a power terminal of the operational amplifying device is connected with a second conductive end of the first conductive device, and the operation amplifier unit is configured to amplify and output the supply voltage of the display panel according to the power driving signal.

2. The supply voltage control circuit according to claim 1, wherein the first conductive device is turned on and the second conductive device is turned off when the clock signal is in a first level state; and the first conductive device is turned off and the second conductive device is turned on when the clock signal is in a second level state.

3. The supply voltage control circuit according to claim 1, further comprising:

a reference voltage generator connected between a second input of the operational amplifying device and the ground and configured to generate the reference voltage signal.

4. The supply voltage control circuit according to claim 3, wherein the reference voltage generator comprises a first resistor and a second resistor;

wherein a first end of the first resistor and a second end of the second end is in common connection with the second input of the operational amplifying device, a second end of the first resistor is grounded, and a second end of the second resistor is connected with an output of the operational amplifying device.

5. The supply voltage control circuit according to claim 3, wherein the reference voltage generator comprises a reference voltage source, a sixth resistor, a seventh resistor and a third capacitor;

a first end of the sixth resistor, a first end of the seventh resistor and a first end of the third capacitor are in common connection with the second input of the operational amplifying device, a second end of the seventh resistor is grounded, a second end of the third capacitor is grounded, a positive electrode of the reference voltage source is connected with a second end of the sixth resistor, and a negative electrode of the reference voltage source is grounded.

6. The supply voltage control circuit according to claim 1, wherein the first conductive device comprises a first switching transistor; and wherein a control electrode of the first switching transistor is connected with the clock, a first conductive electrode of the first switching transistor is connected with the power supply, and a second conductive electrode of the first switching transistor is connected with a power terminal of the operation amplifier unit.

7. The supply voltage control circuit according to claim 1, wherein the first conductive device comprises a plurality of cascaded switching transistors;

in the plurality of cascaded switching transistors, a second conductive electrode of a previous switching transistor is connected with a first conductive electrode of a next switching transistor, a first conductive electrode of a first switching transistor is connected with the power supply, and a second conductive electrode of a last switching transistor is connected with the power terminal of the operation amplifier unit, a control electrode of each of the switching transistors is connected with the clock.

8. The supply voltage control circuit according to claim 1, wherein the second conductive device comprises a second switching transistor;

wherein a control electrode of the second switching transistor is connected with the clock, a first conductive electrode of the second switching transistor is connected with the supply voltage output of the display panel, and the second conductive electrode of the second switching transistor is a first voltage output of the supply voltage control circuit.

9. The supply voltage control circuit according to claim 1, wherein the second conductive device comprises a plurality of cascaded switching transistors;

in the plurality of cascaded switching transistors, a second conductive electrode of a previous switching transistor is connected with a first conductive electrode of a next switching transistor, a first conductive electrode of a first switching transistor is connected with the supply voltage output of the display panel, and a second conductive electrode of a last switching transistor is a first voltage output of the supply voltage control circuit, and a control electrode of each of the switching transistors is connected with the clock.

10. The supply voltage control circuit according to claim 1, wherein the operational amplifying device comprises an operational amplifier;

wherein a first input of the operational amplifier is connected with the supply voltage output of the display panel, a second input of the operational amplifier is connected with the reference voltage signal, a power terminal of the operational amplifier is connected with the second conductive end of the first conductive device, and an output of the operational amplifier is a second voltage output of the supply voltage control circuit.

11. The supply voltage control circuit according to claim 1, wherein the operational amplifying device comprises a comparator;

wherein a first input of the comparator is connected with the supply voltage output of the display panel, a second input of the comparator is connected with the reference voltage signal, a power terminal of the comparator is connected with the second conductive end of the first conductive device, and an output of the comparator is a second voltage output of the supply voltage control circuit.

12. The supply voltage control circuit according to claim 1, wherein the operational amplifying device comprises a third resistor, a fourth resistor, a fifth resistor, a first triode and a second triode;

wherein a first end of the third resistor and a first end of the fourth resistor are in common connection to form a power terminal of the operational amplifying device, a second end of the third resistor is connected with a collector electrode of the first triode, a second end of the fourth resistor is connected with a collector electrode of the second triode, an emitting electrode of the first triode and an emitting electrode of the second triode are in common connection with a first end of the fifth resistor, and a second end of the fifth resistor is grounded;
a base electrode of the first triode is a first input of the operational amplifying device, and a base electrode of the second triode is a second input of the operational amplifying device, and the second end of the fourth resistor and the collector electrode of the second triode are in common connection to form an output of the operational amplifying device.

13. The supply voltage control circuit according to claim 1, wherein the clock comprises:
an oscillation circuit configured to generate an oscillation signal; and
a clock chip which has an oscillation signal input pin and an oscillation signal output pin connected with the oscillation circuit, and is configured to generate the clock signal.

14. The supply voltage control circuit according to claim 13, wherein the oscillation circuit comprises a first capacitor, a second capacitor and a first crystal oscillator;
wherein a first end of the first capacitor and a first end of the second capacitor are grounded, a second end of the first capacitor and a first end of the first crystal oscillator are in common connection to form a first oscillation signal output of the oscillation circuit, a second end of the second capacitor and a second end of the first crystal oscillator are in common connection to form a second oscillation signal output of the oscillation circuit; wherein both the first oscillation signal output and the second oscillation signal output of the oscillation circuit are connected with the clock chip.

15. The supply voltage control circuit according to claim 1, wherein the supply voltage control circuit further comprises:
a voltage stabilizer connected with an output of the operation amplifier unit and configured to perform voltage stabilization operation on the amplified supply voltage of the display panel.

16. The supply voltage control circuit according to claim 15, wherein the voltage stabilizer comprises a voltage stabilization chip, a second crystal oscillator, a third crystal oscillator, a first zener diode and a second zener diode;
wherein a power input pin of the voltage stabilization chip and a first end of the second crystal oscillator are in common connection to form a voltage input of the voltage stabilizer, a first end of the third crystal oscillator, a cathode of the second zener diode and a power output pin of the voltage stabilization chip are in common connection to form a voltage output of the voltage stabilizer, a second end of the second crystal oscillator, a cathode of the first zener diode, an anode of the second zener diode and a second end of the third crystal oscillator are in common connection with a ground pin of the voltage stabilization chip, and an anode of the first zener diode is grounded; and
wherein a voltage input of the voltage stabilizer is connected with an output of the operational amplifying device.

17. A display panel, comprising:
at least one scanning line which is vertically arranged in array;
at least one data line which is horizontally arranged in array;
a grid driver connected with the scanning line and configured to generate a scanning signal;
a source driver connected with the data line and configured to generate a data signal; and
a supply voltage control circuit for the display panel, which is connected with the scanning line and the data line, wherein the supply voltage control circuit comprises:
a clock configured to generate a clock signal;
a first conductive device, wherein a first conductive end of the first conductive device is connected with a power supply, a control end of the first conductive device is connected with the clock, and the first conductive device is configured to be turned on or turned off according to the clock signal and generate a power driving signal when being turned on;
a second conductive device, wherein a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and
an operational amplifying device, wherein a first input of the operational amplifying device is connected with the supply voltage output of the display panel, a second input of the operational amplifying device is connected with a reference voltage signal, a power terminal of the operational amplifying device is connected with a second conductive end of the first conductive device, and the operation amplifier unit is configured to amplify and output the supply voltage of the display panel according to the power driving signal.

18. The display panel according to claim 17, wherein the supply voltage control circuit further comprises:
a reference voltage generator connected between a second input of the operational amplifying device and the ground and configured to generate the reference voltage signal.

19. The display panel according to claim 17, wherein the supply voltage control circuit further comprises:
a voltage stabilizer connected with an output of the operational amplifying device and configured to perform voltage stabilization operation on the amplified supply voltage of the display panel.

20. A display device, comprising a display panel;
wherein the display panel comprises:
at least one scanning line which is vertically arranged in array;
at least one data line which is horizontally arranged in array;
a grid driver connected with the scanning line and configured to generate a scanning signal;
a source driver connected with the data line and configured to generate a data signal; and
a supply voltage control circuit for the display panel, which is connected with the scanning line and the data line, wherein the supply voltage control circuit comprises:
a clock configured to generate a clock signal;
a first conductive device, wherein a first conductive end of the first conductive device is connected with a power supply, a control end of the first conductive device is connected with the clock, and the first conductive device is configured to be turned on or turned off according to the clock signal and generate a power driving signal when being turned on;

a second conductive device, wherein a control end of the second conductive device is connected with the clock, a first conductive end of the second conductive device is connected with a supply voltage output of the display panel, a second conductive end of the second conductive device is a first voltage output of the supply voltage control circuit, and the second conductive device is configured to be turned on or turned off according to the clock signal; and an operational amplifying device, wherein a first input of the operational amplifying device is connected with the supply voltage output of the display panel, a second input of the operational amplifier operational amplifying device is connected with a reference voltage signal, a power terminal of the operational amplifying device is connected with a second conductive end of the first conductive device, and the operation amplifier unit is configured to amplify and output the supply voltage of the display panel according to the power driving signal.

\* \* \* \* \*